(12) United States Patent
Cheim et al.

(10) Patent No.: US 10,001,518 B2
(45) Date of Patent: Jun. 19, 2018

(54) SYSTEM AND METHOD FOR POWER TRANSMISSION AND DISTRIBUTION ASSET CONDITION PREDICTION AND DIAGNOSIS

(71) Applicant: ABB Technology AG, Zurich (CH)

(72) Inventors: Luiz Cheim, St. Charles, MO (US); Lan Lin, Raleigh, NC (US)

(73) Assignee: ABB Schweiz AG, Baden (CH)

( * ) Notice: Subject to any disclaimer, the term of this patent is extended or adjusted under 35 U.S.C. 154(b) by 473 days.

(21) Appl. No.: 13/759,026

(22) Filed: Feb. 4, 2013

(65) Prior Publication Data

US 2014/0222355 A1 Aug. 7, 2014

(51) Int. Cl.
*G01R 31/02* (2006.01)
*G05B 23/02* (2006.01)

(52) U.S. Cl.
CPC .......... *G01R 31/02* (2013.01); *G05B 23/024* (2013.01)

(58) Field of Classification Search
CPC ..... G01R 31/02; G01R 31/027; G05B 23/024
See application file for complete search history.

(56) References Cited

U.S. PATENT DOCUMENTS

| 4,839,823 A | 6/1989 | Yoshihiro |
| 6,415,276 B1 | 7/2002 | Heger et al. |
| 2007/0050302 A1 | 3/2007 | Cheim |
| 2008/0086283 A1 | 4/2008 | Yuan et al. |
| 2009/0312880 A1 | 12/2009 | Cheim |
| 2009/0312881 A1 | 12/2009 | Cheim |

FOREIGN PATENT DOCUMENTS

| WO | WO 02/097545 A1 | 12/2002 |
| WO | WO2012142355 A1 | 10/2012 |

OTHER PUBLICATIONS

Tang et al., A Bayesian Network Approach to Power System Asset Management for Transformer Dissolved Gas Analysis, Apr. 6-9, 2008, DRPT2008, Nanjing, China, pp. 1460-1466.*
Sand et al., Application of Bayesian Networks for Maintenance and Risk Modelling, 2010 IEEE, pp. 530-535.*
Velasquez-Contreras et al., General Asset Management Model in the Context of an Electric Utility: Application to Power Transformers, Jul. 19, 2011, Electric Power Systems Research 81, pp. 2015-2037.*

(Continued)

*Primary Examiner* — Toan Le
(74) *Attorney, Agent, or Firm* — J. Bruce Schelkopf; Taft Stettinius & Hollister LLP (57) ABSTRACT

A computer-implemented system and method for predictive and diagnostic analysis of an electrical transmission, generation and distribution asset health includes a computer with a non-transient computer readable medium able to receive data regarding an asset, its components, component subsystem and parameters related thereto. Instructions stored on the non-transient computer readable medium execute instructions that predictively calculate overall asset health and also calculated the states of subsystems and component parameters, providing a diagnostic of the causes of poor asset health.

17 Claims, 7 Drawing Sheets

(56) References Cited

OTHER PUBLICATIONS

Pourali et al., A Bayesian Approach to Online System Health Monitoring, Jan. 28-31, 2013, Published in: Annual Proceedings of Reliability and Maintainability Symposium (RAM), 6 pp.*

Abstract of Pourali et al. reference, Jan. 28-31, 2013, Published in: Annual Proceedings of Reliability and Maintainability Symposium (RAM), 2 pp.*

IAEA-TECDOC-1551, "Implementation Strategies and Tools for Condition Based Maintenance at Nuclear Power Plants" May 1, 2007, International Atomic Energy Agency, ISBN 92-0-103907-7.

Handschin, et al., "Novel Methods for the Condition Based Maintenance of Distribution Networks"; Power Tech, 2007, IEEE Piscataway, New Jersey, USA, ISBN: 978-1-4244-2189-3.

Shoureshi et al., "Sensor fusion and complex data analysis for predictive maintenance", Proceedings of the 36th Annual Hawaii International Conference on System Sciences, 2003, Jan. 1, 2003, ISBN: 978-0-76-951874-9.

Byington et al., "Data Fusion for Developing Predictive Diagnostics for Electromechanical Systems", Jan. 1, 2001, Retrieved from the Internet on Feb. 10, 2014: URL:http://dsp-book.narod.ru/HMDF/2379ch23.pdf.

Zhang, Z.; Jiang, Y.; McCalley, J.; Bayesian Analysis of Power Transformer Failure Rate Based on Condition Monitoring Information; 2004; Iowa State University.

Pourali, M.; Mosleh, A.; A Bayesian Approach to Functional Sensor Placement Optimization for System Health Monitoring; IEEE Conference on Prognostics and Health Management (PHM), Jun. 18, 2012.

The State Intellectual Property Office of the People's Republic of China, First Office Action for corresponding Chinese patent application No. 201480014427.5.9 dated Feb. 5, 2018. Feb. 5, 2018.

* cited by examiner

| OilQuality | BAD | | | | | | | | |
|---|---|---|---|---|---|---|---|---|---|
| InfraRed | BAD | | | | | | | | |
| OilLeak | BAD | | | | | | | | |
| Dessicant | BAD | | | | | | | | |
| OilLevel | | BAD | | | | GOOD | | | |
| BagMemb | | BAD | | GOOD | | BAD | | GOOD | |
| Gauges | BAD | GOOD | BAD | GOOD | BAD | GOOD | BAD | GOOD |
| BAD | 0.9786666 | 0.968 | 0.957333 | 0.936 | 0.943111 | 0.914666 | 0.872 | 0.84 |
| GOOD | 0.0213333 | 0.032 | 0.042666 | 0.064 | 0.056888 | 0.085333 | 0.128 | 0.16 |

SYSTEM AND METHOD FOR POWER TRANSMISSION AND DISTRIBUTION ASSET CONDITION PREDICTION AND DIAGNOSIS

FIELD OF INVENTION

The present disclosure relates to the prediction and diagnosis of conditions of power transmission and distribution assets such as transformers, circuit breakers and batteries. In particular, the present disclosure relates to a statistical approach to asset fault diagnosis, detection and overall asset health.

BACKGROUND

Electrical assets such as transformers, circuit breakers and batteries involve tremendous cost and their proper maintenance is necessary to maximize the value realized from the assets over their lifespans. A significant amount of operational information of the assets can be obtained through sensors, supervisory and control systems, and through inspection by trained technicians. It can be desirable to analyze the operational information in order to predict asset faults and to diagnose the causes of asset faults.

SUMMARY

A computer-implemented system and method for predictive and diagnostic analysis of an electrical transmission, generation and distribution asset health includes a computer with a non-transient computer readable medium able to receive data regarding an asset, its components, component subsystem and parameters related thereto. Instructions stored on the non-transient computer readable medium execute instructions that predictively calculate overall asset health and also calculated the states of subsystems and component parameters, providing a diagnostic of the causes of poor asset health.

BRIEF DESCRIPTION OF THE DRAWINGS

In the accompanying drawings, structures and methods are illustrated that, together with the detailed description provided below, describe aspects of a system and method for diagnosing and predicting faults and overall electrical asset condition. It will be noted that a single component may be designed as multiple components or that multiple components may be designed as a single component.

Further, in the accompanying drawings and description that follow, like parts are indicated throughout the drawings and written description with the same reference numerals, respectively. The figures are not drawn to scale and the proportions of certain parts have been exaggerated for convenience of illustration.

DETAILED DESCRIPTION

Figure 1:
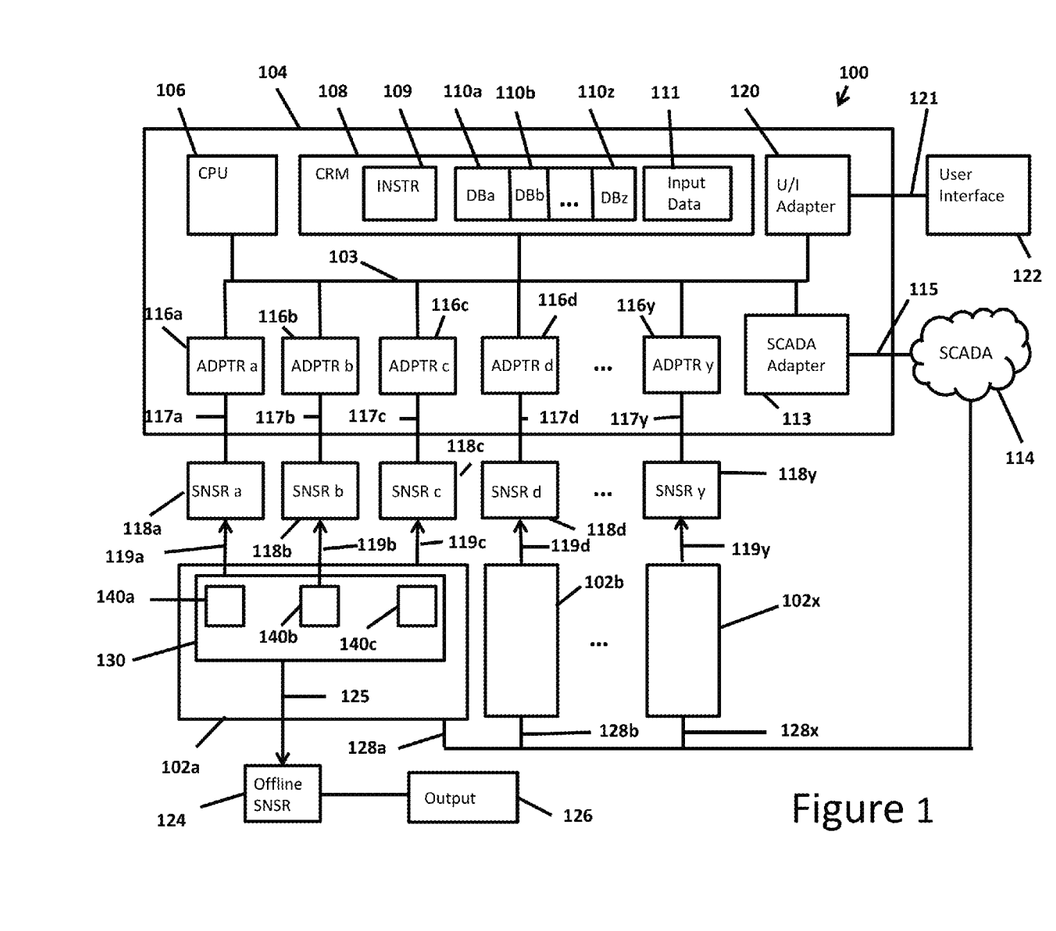
FIG. 1 illustrates diagram of system 100.

FIG. 1 illustrates condition detection and diagnostic computer system 100 for use in the management of a plurality of assets 102a to 102x of electrical power generation and distribution systems. Assets 102a-102x illustrated in FIG. 1 are transformers. However, according other aspects of the present teachings the detection and diagnostic system 100 can be implemented with other assets 102a-102x. Assets 102a-102x can include, but are not limited to various types of transformers such as large, medium and small distribution transformers, power generation transformers, dry-type transformers, pole-mounted transformers and high power transformers. Assets 102a-102x can also include non-transformer assets, including but not limited to circuit breakers, switches, surge arresters, batteries, cooling systems, lines and line connections, relays or other devices implemented in power generation and distribution systems.

The detection and diagnostic system 100 includes a computer 104. The computer 104 can include a processor 106, non-transient computer readable medium 108 such as a hard drive or random-access memory (RAM) that can store executable instructions 109, one or more databases 110a-110z and input data 111 such as provided by online sensors 118a-118y. The computer 104 also includes a supervisory control and data acquisition (SCADA) adapter 113 for communication with SCADA network 114 through connection 115 and communications adapters 116a-116y for communication with online sensors 118a-118y through communications connections 117a-117y. Communications between the internal components of the computer 104 can be affected through bus 103.

User interface adapter 120 permits communication between user interface 122 and system 100 through connection 121. The user interface 122 can take several forms, including but not limited to a touchscreen, a keyboard, monitor or mouse. In other aspects, several forms of user interface 122 can be implemented by connecting to one or more suitable interface adapter 120. For example, a configuration including a keyboard, monitor and mouse can be implemented with off the shelf computer 104. In another example, the system 100 can be implemented on a tablet device with a touchscreen. In general and without limitation the systems and methods described herein can be implemented on a variety of computing devices having a variety of forms including but not limited to mainframes, distributed systems, laptops computers, desktop computers and hand-held devices such as tablets.

The communications adapters 116a-116y can take a variety of suitable forms that permit data to be transmitted from online sensors 118a-118y to the computer 104. Connections 117a-117y between online sensors 118a-118y and computer 104 can be hard line connections or wireless connections, and can be in the form of a variety of communications protocols such as, for example and without limitation, DNP3.0, MODBUS or IEC61850. Standard internet or network communications protocols can also be implemented. As just one non-limiting example, one or more of the communications adapters 116a-116y can connect the computer 104 to a company intranet or a proprietary TCP/IP network. Thus, any one or more of the online sensors 118a-118y can establish a connection 117a-117y through such a company intranet or a proprietary TCP/IP network. The online sensors 118a-118y detect sensor input information 119a-119y regarding the condition and operational parameters of the assets 102a-102x, the condition and operational parameters of asset components 130 and the condition and operational parameters of component subsystems 140a-140c. It should be noted that while the asset 102a is shown with one asset component 130 and three subsystems 140a-140c, as discussed further herein a plurality of asset components 130 can be included in a particular asset 102a-102x, each with one or more subsystems 140a-140c. The sensor input information 119a-119y gathered by the online sensors 118a-118y results in an output by the online sensors 118a-118y, which can be written as input data 111 on the computer-readable medium 108 and used to update one or more the databases 110a-110z according to the present teachings. As used herein, asset 102 data, component 130 data, component 130 parameter data and subsystem data refer to the stored information regarding operational information regarding the condition of the respective assets 102 and constituents parts and representative parameters, whether received through an online sensor 118a-118y, offline sensor 124, SCADA network 114 or manually entered technician readings or expert information.

Online sensors 118a-118y can provide output data related to the assets 102a-102x to computer 104 continuously or intermittently. Intermittent signals can be provided to computer 104 sporadically or can arrive after periodic time intervals ranging from milliseconds to days. Output data can be transmitted automatically by sensors 118a-118y or can be requested by computer 104.

In addition to online sensors 118a-118y, offline sensor 124 can also detect operational information 125 regarding the assets 102. Data can be collected from offline sensor 124 in a variety of ways. A technician can record a sensor 124 reading and then manually enter the data through user interface 122. Offline sensors 124 can also produce sensor output 126 which can take the form of a reading on the sensor 124, such as the reading on a gauge located on the sensor 124. In another example, data from sensor 124 can be written to a non-transient computer-readable medium local to the sensor 124, which can then be transferred by uploading to computer 104, for example by copying to a portable non-transient medium that can be further copied to non-transient computer readable medium 108.

In addition to data received from online sensors 118 and offline sensors 124, operational data of the assets 102a-102x can be obtained through the SCADA network 114 with the use of remote terminal units (RTU) disposed locally to assets 102a-102x. While a SCADA network 114 is shown in FIG. 1, other asset control and data acquisition protocols can also be implemented according to the present teachings, including but not limited to the Distributed Control System (DCS). Data received from the SCADA network 114 includes, but is not limited to voltage or current load magnitude and phase, ambient temperature, top oil temperature, winding temperature, trip state of relays and various alarms related to assets 102a-102x. SCADA data, for example as received from RTUs local to the assets 102a-102x, is transmitted through connections 128a-128x and is thereafter transmitted to computer 104 through communication connection 115. Information received through a SCADA network can be stored in a historian which maintains long-term operational data about the particular asset 102a-102x. The historian can be stored as one or more databases 110a-110z on computer 104.

In addition to online sensors 118a-118y, offline sensor 124 and information obtained from the SCADA network 114, other forms of evaluations of the assets 102a-102x can be performed. For example, evaluation of the condition of the paint on the assets 102a-102x does not require instrumentation to detect, and can be performed by a technician using subjective judgment to evaluate conditions. As discussed further herein, assignment of a qualitative evaluation or quantitative result, such as can result from an online sensor 118a-118y reading or offline sensor 124 reading into one of the available states of a corresponding random variable permits modeling of that variable.

Online sensors 118a-118y, offline sensor 124, information from SCADA network 114 and any other evaluation performed on the asset 102a-102x can involve a large sampling of operating conditions of assets 102a-102x including information received regarding the asset 102a itself, such as received through sensor 118c. More granular information is available through detection of the parts of the assets 102a-102x. The condition or operational parameters of asset component 130 is received by sensor 118a, and the condition or operational parameters of component subsystems 140b is received by sensor 118b. Examples of asset components 130 include the load tap changer, the oil preservation system, cooling system, bushings, surge arrester, the main tank and the active part of the transformer assets 102a-102x. Examples of asset 102a-102x parameters are the operational history, maintenance record and number of faults experienced by the assets 102a-102x. Parameters that are attributable to the overall asset 102a-102x can be identified as asset parameters. Examples of subsystems 140a-140c are the desiccant, which is a subsystem of the oil preservation system, or fans and pumps, which are a subsystem of the cooling system. Examples of component parameters include the number of operations as a parameter for the load tap changer component 130, or oil level as a parameter of the oil preservation system. It should be noted that certain parameters and subsystems 140a-140c will be shared or be equally applicable to more than one component 130. For example, noise levels causing damaging vibration can be shared among the main tank, cooling system and the active part.

Figure 2:
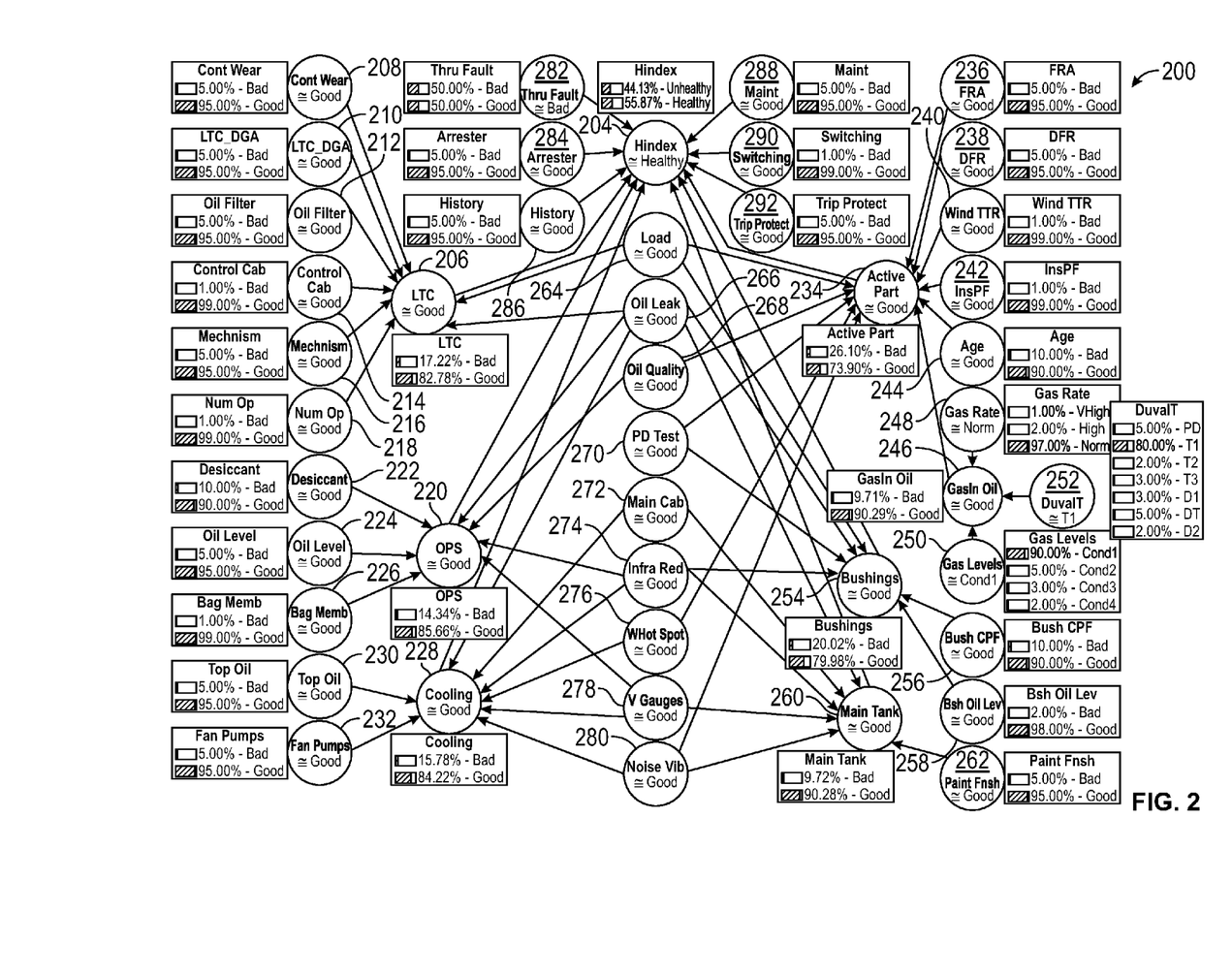
FIGS. 2-4 illustrates Bayesian model 200 of the health of asset 102.

With reference to FIG. 2, a Bayesian network 200 models the health condition of one of assets 102a-102x, which can be referred to herein individually or collectively as asset 102. Reference to asset 102 is exemplary and not limiting. The network 200 is in the form of a directed, acyclic graph having arrows 202 and nodes 204-288 representing the probabilistic state of the asset, asset parameters, components 130, component subsystems 140a-140c and component parameters. The probability distribution for a particular node variable is shown next to the node. Each node is associated with a random variable corresponding to the asset health, asset parameters, components 130, component subsystems 140a-140c and component parameters. The random variable associated with any particular node can have one or more possible states or outcomes based on its particular characteristics. A probability distribution across those states or outcomes reflects historical data, any expert information incorporated into the distributions and any updates to distributions as can be performed according to the teachings herein. The arrow 204 indicates that the status of the asset parameters, components 130, component subsystems 140a-140c and component parameters associated with the node from which the arrow originates has a causal relationship with the asset 102 and components 130 associated with the nodes at which the arrow terminates at the arrowhead.

The asset node 204 labeled HINDEX represents the overall health of the system, as indicated by the value in the GOOD outcome. Relatively higher scores in the GOOD outcome of the HINDEX variable indicate relatively better asset 102 health. A distribution of greater than 50% BAD is considered a fault reading, which can trigger technician action. It should be noted that the probability distributions in the nodes in FIG. 2 are normalized, such that the probability the random variable is in one of the available states of any particular node is 100%. According to one aspect of the present teachings, the distribution of outcomes for each node can be from 2 to any integer number of states, whether the 2 conditions are for example and without limitation fault and no fault, true and false, on and off or others pairing of states.

The LTC component node 206 corresponds to the on-load tap changer, a mechanism that changes the number of active turns on a transformer winding while the transformer, such as asset 102 is in operation. The on-load tap changer has a variety of properties and subsystems, the corresponding states of which effect the state distribution of the LTC node 206 as shown by the relationships dictated by the arrows 202 in the network 200.

Several subsystems and parameters have a causal effect on the LTC component node 206. The subsystem node 208 for the random variable ContWear corresponds to the wear to the tap changer contacts that come into contact with the diverter switch. The condition of the contacts can be determined by visual inspection the results of which can then be stored in the database 110a-110z. Online sensors 118a-118y and offline sensor 124 can also detect behavior associated with contact wear and performance and thereby infer contact performance and wear. The LTC_DGA node 210 corresponds to the dissolved gas analysis random variable for the oil system of the load tap changer. The oil system of the load tap changer is separate from and occupies a smaller volume that the oil system for the transformer asset 102. As such, the oil occupying the load tap changer oil system can degrade in a manner different from the oil in the asset's 102 oil system. Various online sensors 118a-118y and offline sensors 124 are available for performing detection of the dissolved gas in the load tap changer oil and providing empirical data corresponding to the LTC_DGA random variable. The OilFilter node 212 corresponds to the condition of the oil filter of the load tap changer, which can be measured by the time from the last replacement or for example by checking the oil pressure at the filter. The ControlCabinet node 214 refers to the condition of the load tap changer control cabinet. Evaluation of the control cabinet can be performed visually by determining whether any connections of the circuitry are loose and whether any heater installed in the cabinet is operating correctly. The Mechanism node 216 corresponds to the status of the mechanism of the load tap changer, such as any motors, springs, switches, shaft, gears and motor protection equipment. Evaluation of the mechanism can be performed visually, or can be a function of the device's 102 duration of service. The NumOp node 218 corresponds to the number of operations since the most recent previous maintenance was performed on the load tap changer.

The OPS node 220 corresponds to the oil preservation system of the asset 102, which is responsible for separating the oil from outside air and also preserving the oil by removing gasses and contaminants from the oil. The subsystem and parameters having a causal effect on the oil preservation system include the desiccant, oil level and oil bag. The Desiccant node 222 corresponds to the desiccant, which removes moisture and can have a predetermined lifespan. As such, the random variable associated with the Desiccant node 222 can correspond to the lifespan of the desiccant. The Oil Level node 224 corresponds to the oil level in the transformer. The Bag Member node 226 corresponds to the oil bag, which if compromised, can result not only in leakage of oil but of contaminants into the oil.

The Cooling node 228 corresponds to the cooling system of the asset 102. The node 230 corresponding to the random variable TopOilTemp relates to the oil temperature within the cooling system, while the FanPumps node 232 corresponds to the fans and pumps used to circulate air around the heat exchangers of the asset 102 and facilitate circulation of the oil within the asset 102. The current to the fans and pumps can be indicative of motor failure, and so can serve as an observable of the random variable for the FanPumps node 232.

The ActivePart node 234 corresponds to the active part of the transformer asset 102, which includes the windings and core of the transformer, accessories thereto and mechanical supports for the winding and core. The node 236 associated with the random variable FRA corresponds to the frequency response analysis of the transformer asset 102. Frequency response analysis is used to detect mechanical movement or damage in the active part of the transformer asset, including the winding and core. The goal of a frequency response analysis is to determine whether displacement has occurred, with age or as a result of a particular event, including but not limited to events such as refurbishment, repair, accident, fault or transportation. Standardized procedures for performing frequency response analysis measurements can be found in the IEEE Draft Guide for the Application and Interpretation of Frequency Response Analysis for Oil Immersed Transformers; PC57.149/D9.3, August 2012. The DFR node 238 corresponds to dielectric frequency response analysis. The dielectric frequency response analysis involves measuring the capacitance and dielectric loss of insulating material over a frequency spectrum. The WindTTR node 240 is associated with the transformer turns ratio test of the windings. The transformer turns ratio test involves testing the output voltage at no load when an input voltage is applied to the transformer. The InsPF node 242 is associated with the insulation power factor, which is measured by determining the dielectric loss leakage current of the transformer oil of the asset 102. The AGE node 244 corresponds to the age of the active part. The GasInOil node 246 depends on the random variables for the GasRate node 248, GasLevels node 250 and DuvalT node 252. The GasRate node 248 corresponds to the rate of gas production for one or more gasses dissolved in the asset 102 oil, including but not limited to Hydrogen, Methane, Ethylene, Ethane, Acetylene, Propane, Carbon Monoxide and Carbon Dioxide. The GasLevels node 250 corresponds to the levels of dissolved gasses in the asset 102 oil. The DuvalT variable concerns the result of a Duval Triangle analysis for the asset 102, with the different possible states of the random variable corresponding to the different zones of the Duval Triangle. The weighted distribution of the states of the random variable for the GasInOil node 246 are dependent on the distributions of the random variables for the GasRate node 248, GasLevels node 250 and DuvalT node 252. It should be noted that the GasRate node 248, GasLevels node 250 and DuvalT node 252 have more than two possible outcomes.

The Bushings node 254 corresponds to the bushings of the asset 102. The BushCPF node 256 and BshOilLev node 258 correspond to the capacitance and power factor of the bushings, and the level of the insulating oil in the bushing, respectively. The MainTank node 260 corresponds to the condition of the main tank of the asset. The PaintFnsh node 262 corresponds to the state of the outer finish of the tank. For example, deterioration of the paint and exposure of the underlying metal of the tank can increase the amount of tank corrosion and expedite the onset of corrosion.

Several other nodes represent random variables associated with subsystems and component parameters the state of which effect multiple components. For these nodes, the corresponding probability distributions have been omitted for clarity. The Load node 264 corresponds to the Load on the asset 102. The OilLeak node 266 corresponds to the total number of events of leakage or alternatively the amount of oil leakage. The OilQuality node 268 corresponds to the presence or lack of contaminants in the insulating oil. The PDTest node 270 corresponds to partial discharge tests. During partial discharge tests a high voltage source is applied to the asset, and partial discharges of the transformers are performed and the resulting characteristics are observed. Partial discharge tests include dielectric frequency response (DFR) and frequency response analysis (FRA). The MainCab node 272 corresponds to the main control cabinet of the asset 102 and its condition, including whether its heater is operational. The InfraRed node 274 corresponds to thermal issues detected by infrared camera, for example whether any component is has exceeded a reference temperature by a certain number of degrees. The HotSpot node 276 corresponds to winding hotspots, which can be calculated from the oil temperature, load current and design data of the asset 102. The Gauges node 278 corresponds to the condition of the gauges on the asset 102, such as the temperature gauges and oil level gauges on the main tank. The NoiseVib node 280 corresponds to the level of physical vibration of the asset 102.

Several asset parameters and components are shown for which there is no nodes having a causal relationship with those asset parameters and components such that the arrows point toward the asset parameters and components within the model 200, i.e. such that no other nodes have a causal relationship with the nodes for those asset parameters and components. The ThruFault node 282 reflects how many faults are experienced in a year, which is determined by how often a breaker is tripped to protect the asset 102. The Arrester node 284 corresponds to the over voltage protection system that for example minimizes the effects of lightning. The History node 286 corresponds to one or more of the history of maintenance, replacement, refurbishment and failures. The MAINT node 288 reflects instances of recently performed maintenance or tests. The Switching node 290 corresponds to the operation of the switches of the asset. The TripProtect node 292 corresponds to the history of alarms and trip outs.

In FIG. 2, preliminary distributions for the random variables can be determined by using historical information such as can be stored on a database 110. In determining the distributions, expert knowledge can also be input into the system 100 such as by determining thresholds for which outcomes correspond to particular states of a random variable, and the likelihood of fault conditions when certain probabilistic conditions are met. Such a preliminary probability distribution can serve as a prior distribution in a Bayesian analysis.

Figure 3:
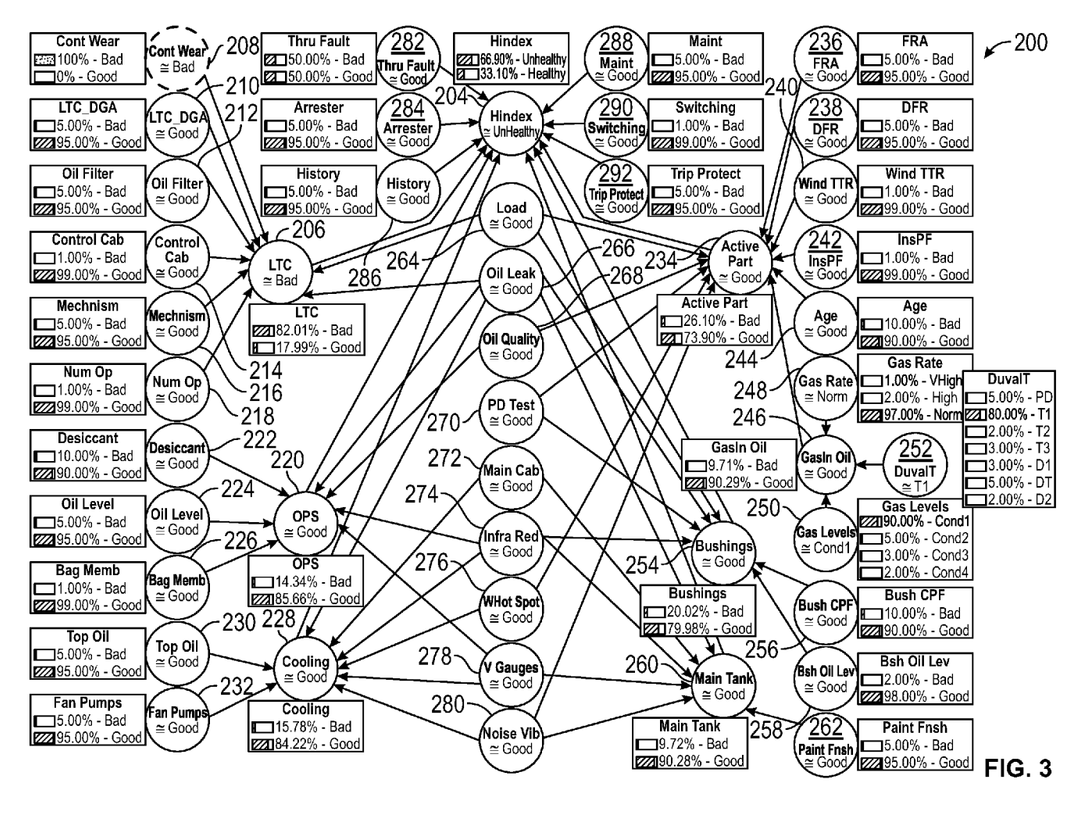

With reference to FIG. 3, the network 200 is been updated to reflect data received regarding the wear level on the load tap changer contacts. A technician evaluating the contacts can for example enter such data. In FIG. 3, data that the contact has completely failed adjusts the ContWear random variable at node 208 to 100% in a fault condition, referred to as BAD in the node 208. The probability the LTC node 206 is in a fault state is causally dependent, in part, on the state of contact wear.

In general, the notation P(A) corresponds to the probability of A where A is a parameter that can have one or more states, and P(A|B) denotes the probability of A given B. In general, Bayes' Theorem is recited as: P(A|B)=P(B|A)P(A)/P(B). Thus, the probability of A occurring given B having occurred is equal to the probability of B occurring given A, times the probability of A occurring, divided by the probability of B occurring. Bayes' Theorem can be used to calculate an updated probability that the LTC node 206 is in a BAD or fault state given the determination that the state of the contacts of the line tap changer were in the BAD condition with Bayes' Theorem: P(LTC=BAD|ContWear=BAD)=(P(ContWear=BAD|LTC=BAD)P(LTC=BAD))/(P(ContWear=BAD)). Once the probability state of the ContWear node 208 is reflected in the node 208 as 100% BAD, the LTC node 206 is adjusted to reflect the new probability distribution that the load tap changer is 82.01% likely to be in a fault condition, and 17.99% likely to not be in a fault condition. Further, Bayes' Theorem can be used to calculate a probability of the asset 102 being in a fault condition: P(Asset=BAD|LTC=BAD)=(P(LTC=BAD|Asset=BAD)P(LTC=BAD))/(P(Asset=BAD)). The result of the calculation is the index score shown on the asset node 204 FIG. 3, which shows that the updated health score for the asset is 66.90% unhealthy and 33.10% healthy.

The updated distributions for the LTC node 206 and HINDEX node 204 are determined by system 100 based on the input data 111 stored on non-transient computer readable medium 108. In the example shown in FIG. 3, a causal relationship is shown by the directed graph 200 between the load tap changer contact wear represented by the ContWear node 208, and the condition of the load tap changer represented by the LTC node 206, and further to the overall asset represented by the HINDEX node 204. However, with reference to FIG. 4, based on data received concerning a component the system can update the asset health information of the overall asset 102a-102x, as well as the distribution of the random variables corresponding to subsystems and component parameters the conditions of which causally effect the condition of the component.

Figure 4:
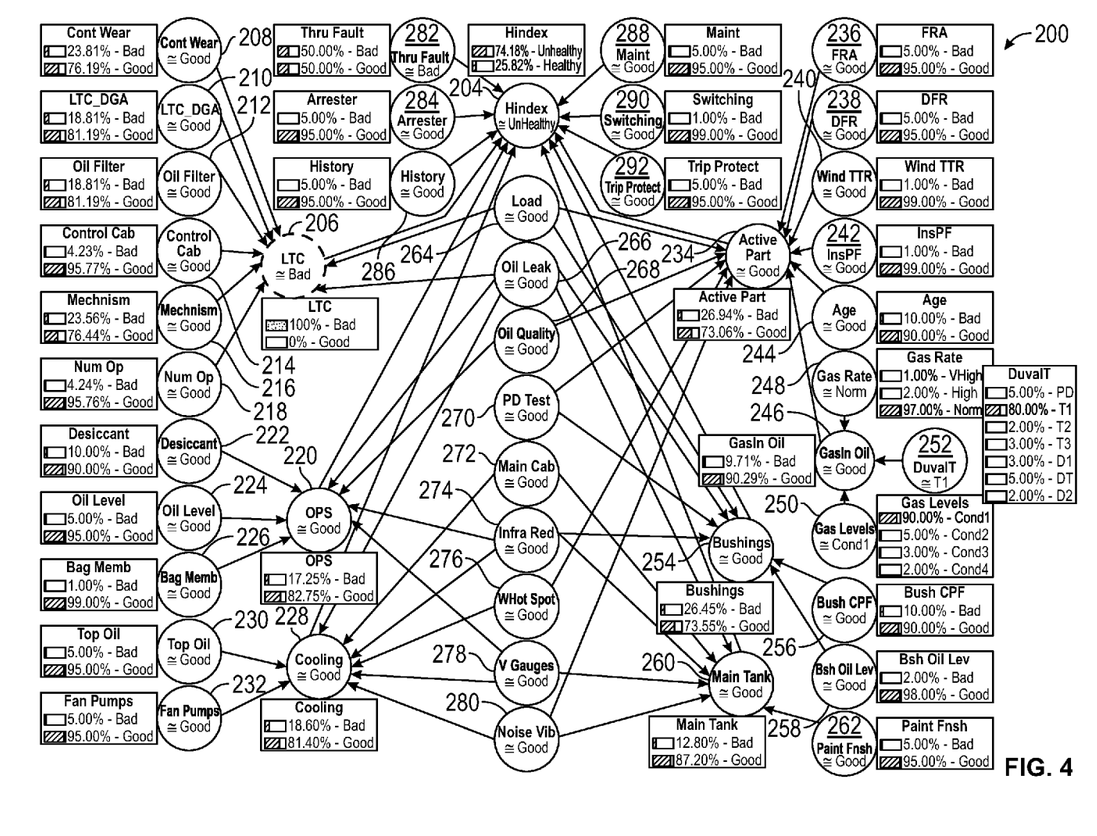

With continued reference to FIG. 4, data regarding the condition of the load tap changer indicating a fault condition, such that with 100% certainty the load tap changer has failed. The probability that the asset will be in an unhealthy condition can be calculated by applying: P(Asset=BAD|LTC=BAD)=(P(LTC=BAD|Asset=BAD)P(LTC=BAD))/(P(Asset=BAD)). With regard to the subsystems and component parameters, the particular update value will be determined by applying Bayes' Theorem. For example, for any random variable X that causally effects the load tap changer, the probability that the random variable is in the BAD state can be determined by applying: P(X=BAD|LTC=BAD)=(P(LTC=BAD|X=BAD)P(LTC=BAD))/(P(X=BAD)). For example, where the random variable to be updated is ContWear, the probability that the random variable ContWear is in a negative state can be determined by applying: P(ContWear=BAD|LTC=BAD)=(P(LTC=BAD|ContWear=BAD)P(LTC=BAD))/(P(ContWear=BAD)). In this way, diagnostic information can be determined upon knowledge of a fault of one of the components 130 or the asset 118a-118x itself.

Figure 5:
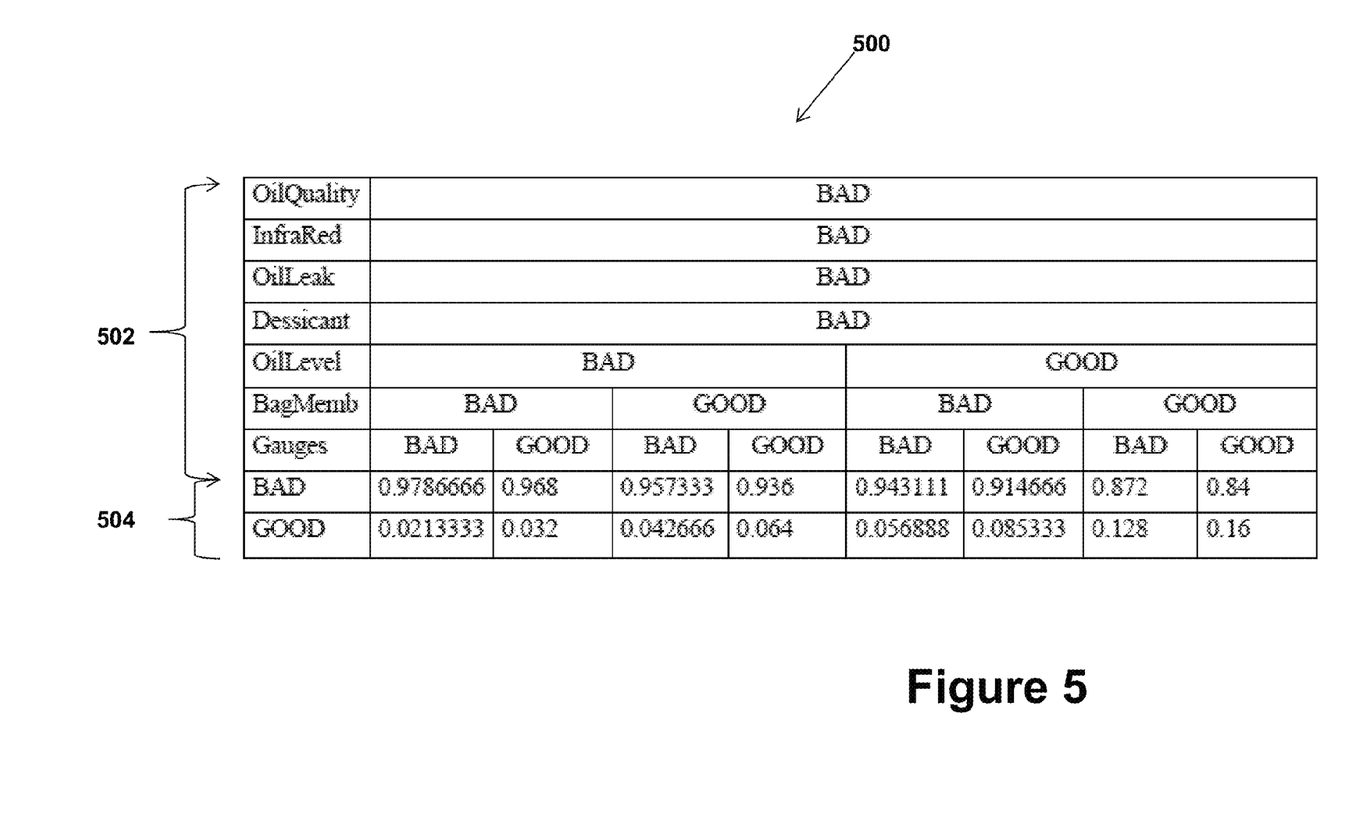
FIG. 5 illustrates a table of probabilities 500 relating the probability distribution of the states of the OPS random variable.

With reference to FIG. 5 a portion of the table of probabilities distribution 500 for the OPS node 220 showing several possible state for the subsystems and parameters 502 relevant to the oil preservation system of the asset 102a-102x. In particular, the portion of the table showing the OilQuality, InfraRed, OilLeak and Dessicant random variables having BAD conditions, due to at greater than 50% probability of a BAD classification. The table shows outcomes when the OilLevel, BagMemb and Gauge outcomes are GOOD or BAD, with the table entries 504 corresponding to the health of the oil preservation system. This distribution can be generated for all of the nodes 204-290 by using historical data. Expert information can also be input into the table, representing expert evaluation of the various probability distributions. An expert can supply the initial relationships that are the source for an initial table of probabilities, including the health condition or other initial distribution whether based on historical data or otherwise determined. The tables can be stored as data structures on computer-readable medium 108, for example in a database 110 relating the probability distribution of a particular node as a function of the random variables associated with the nodes causally effecting the particular node in the model 200. The table is also updated as Bayesian probabilities are calculated based on data received from sensors 118 or from testing by technicians, for example.

Figure 6:
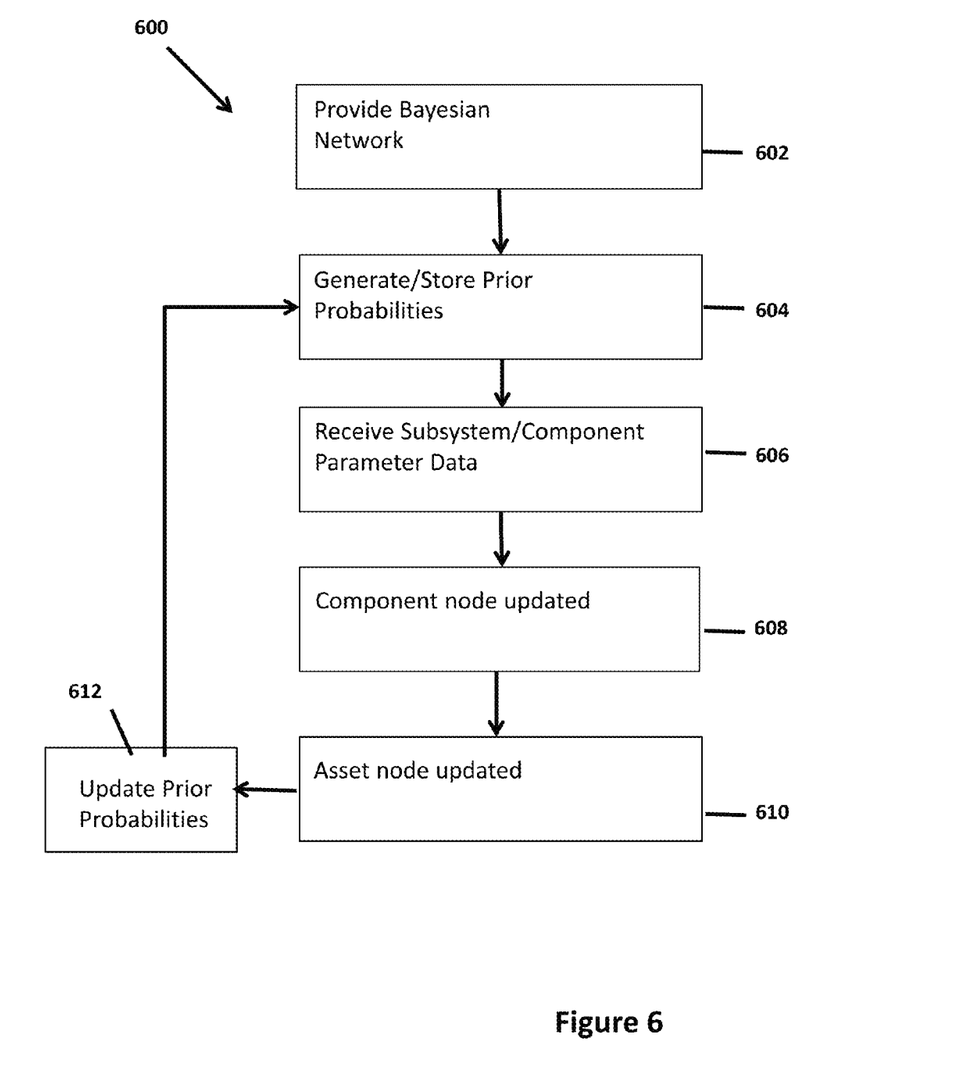
FIG. 6 illustrates method 600.

With reference to FIG. 6, health prediction method 600 includes the step 602 of constructing a Bayesian model 200 of an asset 102. The Bayesian model 200 will be reflected at least in part in the instructions 109 stored on the computer-readable medium 108. In step 604, a distribution of prior probabilities is created and stored in a database of prior probability distributions, for example by using historical probability distributions and expert input information regarding probability distributions. In step 606, subsystem or component parameter data is received, for example as received from a sensor 118 and written as data 111 on computer-readable medium, reflecting operational information of a subsystem or component parameter. In step 608, the probability distribution associated with the component node is updated using Bayes' Theorem, based on the received subsystem or component parameter data. In step 610, the probability distribution associated with the asset node is updated using Bayes' Theorem, based on the updated probability distribution for the component node. In the step 612, the prior probabilities created in step 604 are updated with the new probability distributions for the component node and the asset node.

Figure 7:
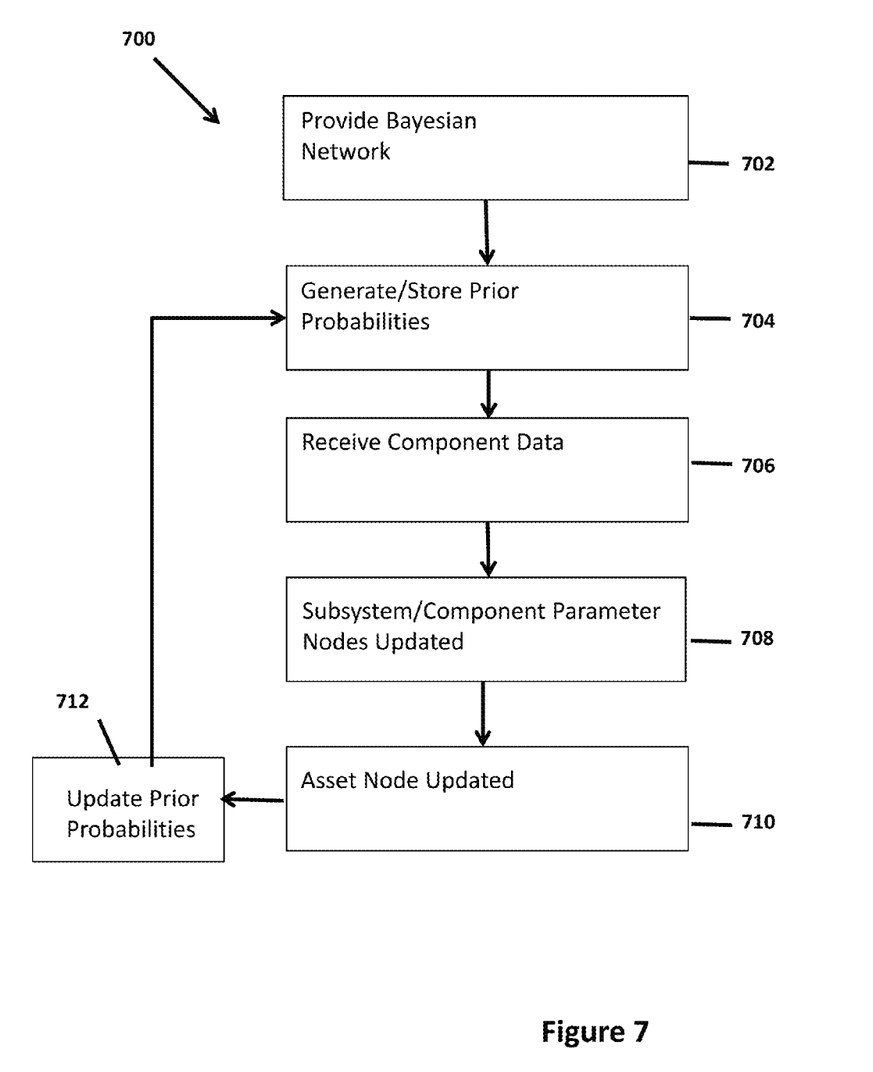
FIG. 7 illustrates method 700.

With reference to FIG. 7, diagnostic method 700 includes the step 702 of constructing a Bayesian model 200 of an asset 102. As with FIG. 6 and method 600, the Bayesian model 200 will be reflected at least in part in the instructions 109 stored on the computer-readable medium 108. In step 704, a distribution of prior probabilities is created and stored in a database of prior probability distributions, for example by using historical probability distributions and expert input information regarding probability distributions. In step 706, component 130 data is received, for example as data 111 on computer-readable medium, reflecting operational information of a component 130. In step 708, the probability distribution associated with the subsystem nodes and component parameter nodes is updated using Bayes Theorem, based on the received component data. In step 710, the probability distribution associated with the asset node is updated using Bayes Theorem, based on the updated probability distribution for the component node. In step 712, the prior probabilities created in step 704 are updated with the new probability distributions for the asset node and nodes for subsystems and component parameters.

For the purposes of this disclosure and unless otherwise specified, "a" or "an" means "one or more." To the extent that the term "includes" or "including" is used in the specification or the claims, it is intended to be inclusive in a manner similar to the term "comprising" as that term is interpreted when employed as a transitional word in a claim. Furthermore, to the extent that the term "or" is employed (e.g., A or B) it is intended to mean "A or B or both." When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995). Also, to the extent that the terms "in" or "into" are used in the specification or the claims, it is intended to additionally mean "on" or "onto." As used herein, "about" will be understood by persons of ordinary skill in the art and will vary to some extent depending upon the context in which it is used. If there are uses of the term which are not clear to persons of ordinary skill in the art, given the context in which it is used, "about" will mean up to plus or minus 10% of the particular term. From about A to B is intended to mean from about A to about B, where A and B are the specified values.

While the present disclosure illustrates various embodiments, and while these embodiments have been described in some detail, it is not the intention of the applicant to restrict or in any way limit the scope of the claimed invention to such detail. Additional advantages and modifications will be apparent to those skilled in the art. Therefore, the invention, in its broader aspects, is not limited to the specific details and illustrative examples shown and described. Accordingly, departures may be made from such details without departing from the spirit or scope of the applicant's claimed invention. Moreover, the foregoing embodiments are illustrative, and no single feature or element is essential to all possible combinations that may be claimed in this or a later application.

The invention claimed is:

1. A detection and diagnostic system for determining a health of a power transformer having one or more subsystems, comprising:
   a plurality of online sensors configured to continuously measure characteristics of power transformer; and
   a computer having a non-transient computer readable medium and configured to receive measurements from the plurality of online sensors, component data, and at least one of component parameter data and subsystem data, and configured to store, with the non-transient computer readable medium, information including:
   the online sensor measurements,
   a Bayesian model including an asset probability distribution, a component probability distribution, a component parameter probability distribution and a subsystem probability distribution, and
   a set of instructions that upon execution are structured to:
   update one of the asset probability distribution, the component probability distribution, the component parameter probability distribution or the subsystem probability distribution using the online sensor measurements, the component data, the component parameter data or the subsystem data,
   update the asset probability distribution using the component probability distribution, the component parameter probability distribution or the subsystem probability distribution,
   update the component parameter probability distribution using the asset probability distribution for power transformer or the component probability distribution,
   update the subsystem probability distribution using the asset probability distribution, the component probability distribution, or the component parameter probability distribution,
   determine the health of power transformer based on updated probability distributions,
   predict a fault of the power transformer using the updated probability distributions, and operate a supervisory control and data acquisition (SCADA) system in response to prediction of the fault to perform supervisory control of the power transformer to a state for maintenance of the power transformer by a technician.

2. The system of claim 1, wherein the computer includes a user input interface and is configured to receive at least one of the component data, component parameter data and subsystem data from at least one of the online sensors and the user input interface.

3. The system of claim 1, wherein the subsystem probability distribution or the component parameter probability distribution includes a probability distribution of at least one of an oil quality, an oil leakage, a load or an infrared parameter.

4. The system of claim 1, wherein the component probability distribution is determined based upon the subsystem probability distribution, the component parameter probability distribution, and a data structure associating the subsystem probability distribution and the component parameter probability distribution with the component probability distribution.

5. The system of claim 1 wherein the instructions written upon the non-transient computer readable medium that upon execution update one of the asset probability distribution, the component probability distribution, the component parameter probability distribution or the subsystem probability distribution perform a Bayesian calculation upon execution.

6. The system of claim 1 wherein the asset probability distribution, the component probability distribution, the component parameter probability distribution and the subsystem probability distribution written on the computer readable medium are normalized.

7. The system of claim 1 further comprising:
an instruction of the set of instructions written upon the non-transient computer readable medium that upon execution updates the asset probability distribution based upon received asset data.

8. The system of claim 1, wherein the probability distribution of the component includes probability distributions of at least one of an oil preservation system, a load tap changer, a cooling system, an active part, a bushing and a main tank.

9. A detection and diagnostic system for determining a health of an electrical transmission or distribution asset having one or more subsystems, comprising:
a plurality of online sensors configured to measure characteristics of the asset; and
a computer having a non-transient computer readable medium and configured to receive measurements from the plurality of online sensors and at least one of subsystem condition data and component parameter condition data, and configured to store, with the non-transient computer readable medium, information including:
the online sensor measurements,
a Bayesian network including a probability distribution of the asset, a probability distribution of an asset component, and a probability distribution of a subsystem parameter written on the computer readable medium,
a first instruction written upon the non-transient computer readable medium that upon execution updates the probability distribution of the asset and the probability distribution of the at least one asset component based upon the online sensor measurements and the received at least one component parameter condition data and subsystem condition data,
a second instruction written upon the non-transient computer readable medium that upon execution updates the probability distribution of the asset using Bayes' Theorem and one of the probability distribution of the asset or the probability distribution of least one asset component and updates the probability distribution of the subsystem parameter using Bayes' Theorem and one of the probability distribution of the asset or the probability distribution of least one asset component,
a third instruction written upon the non-transient computer readable medium that upon execution determines the health of the asset based on updated probability distributions,
a fourth instruction written upon the non-transient computer readable medium that upon execution predicts a fault will occur within the asset using the updated probability distributions, and
a fifth instruction written upon the non-transient computer readable medium that upon execution transmits a fault alert to a control system including a supervisory control and acquisition network (SCADA) in response to predicting the fault, the fault alert effective to cause the control system to isolate the asset from a power source.

10. The system of claim 9, wherein the computer is further configured to store, with the non-transient computer readable medium, information including a sixth instruction that upon execution updates the probability distribution of the asset and the probability distribution of the at least one asset component based upon the received at least one of the subsystem condition data and the component parameter condition data.

11. The system of claim 10, wherein the computer includes a user input interface and is configured to receive the at least one of component data and the subsystem condition data and component parameter condition data from at least one of the online sensors and the user input interface.

12. The system of claim 10, wherein updating the probability distribution of the asset component includes updating a probability distribution of at least one of an oil quality, an oil leakage, a load and an infrared parameter.

13. The system of claim 10, wherein updating the probability distribution of the asset and the probability distribution of the at least one asset component includes updating the probability distribution of the asset and the probability distribution of the at least one asset component based upon oil quality data, oil leakage data, load data or infrared parameter data.

14. The system of claim 9, wherein the instructions that upon execution update the probability distribution of the asset and the probability distribution of the components include instructions to update the probability distribution at least one of an oil preservation system, a load tap changer, a cooling system, an active part, a bushing and a main tank.

15. A method for determining a health of an electrical transmission or distribution asset having one or more subsystems, comprising:
providing a plurality of online sensors configured to continuously measure characteristics of the asset;
providing a computer having a non-transient computer readable medium and configured to receive online sensor measurements, component data and at least one of subsystem data and component parameter data;

receiving the component data and the at least one of the subsystem data and the component parameter data;

executing instructions written upon the non-transient computer readable medium that update a Bayesian network model including probability distribution of the asset, a probability distribution of a subsystem and a probability distribution of a component parameter based upon the online sensor measurements and the received component data;

executing instructions written upon the non-transient computer readable medium that update the probability distribution of the asset using Bayes' Theorem and the probability distribution of the component parameter or the probability distribution of the subsystem;

executing instructions written upon the non-transient computer readable medium that update the probability distribution of the component parameter using Bayes' Theorem and the probability distribution of the asset or the probability distribution of the subsystem;

executing instructions written upon the non-transient computer readable medium that determine the health of the asset based on the updated probability distributions, executing instructions written upon the non-transient computer readable medium that predict a fault will occur within the asset using the updated probability distributions; and executing instructions written upon the non-transient computer readable medium that transmit a fault alert to a supervisory control and acquisition network (SCADA) in response to predicting the fault, the fault alert effective to cause the SCADA network to isolate the asset from a power source.

16. The method of claim 15 further comprising:

executing instructions written upon the non-transient computer readable medium that update the probability distribution of the asset and the probability distribution of the component based upon the received at least one of subsystem data and component parameter data.

17. The system of claim 15, wherein the probability distribution of the subsystem or the probability of the component parameter includes the probability distribution of at least one of an oil quality, an oil leakage, a load and an infrared parameter.

* * * * *